(12) United States Patent
Motoori

(10) Patent No.: US 11,072,493 B2
(45) Date of Patent: Jul. 27, 2021

(54) TRANSPORT SYSTEM AND TRANSPORT METHOD

(71) Applicant: MURATA MACHINERY, LTD., Kyoto (JP)

(72) Inventor: Yoichi Motoori, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/624,935

(22) PCT Filed: May 28, 2018

(86) PCT No.: PCT/JP2018/020351
§ 371 (c)(1),
(2) Date: Dec. 20, 2019

(87) PCT Pub. No.: WO2019/003753
PCT Pub. Date: Jan. 3, 2019

(65) Prior Publication Data
US 2020/0130931 A1 Apr. 30, 2020

(30) Foreign Application Priority Data
Jun. 30, 2017 (JP) .............................. JP2017-128569

(51) Int. Cl.
*B65G 1/04* (2006.01)
*B65G 1/06* (2006.01)
*H01L 21/677* (2006.01)

(52) U.S. Cl.
CPC ......... *B65G 1/0407* (2013.01); *B65G 1/0457* (2013.01); *B65G 1/06* (2013.01); *H01L 21/67733* (2013.01); *H01L 21/67736* (2013.01)

(58) Field of Classification Search
CPC .......... B65G 1/04; B65G 1/0407; B65G 1/06; B65G 1/0457; H01L 21/67736; H01L 21/67733; H01L 21/67727
See application file for complete search history.

(56) References Cited

U.S. PATENT DOCUMENTS 8,712,600 B2 * 4/2014 Hayashi ............ H01L 21/67294
701/2
2003/0229416 A1 12/2003 Tai et al.
(Continued)

FOREIGN PATENT DOCUMENTS

WO 2016/031351 A1 3/2016
WO 2016/178347 A1 11/2016

OTHER PUBLICATIONS

Official Communication issued in International Patent Application No. PCT/JP2018/020351, dated Aug. 28, 2018.

*Primary Examiner* — Glenn F Myers
(74) *Attorney, Agent, or Firm* — Keating & Bennett, LLP

(57) ABSTRACT

A transport system includes a stocker including a crane overhead track and a suspension crane that transports an article between storages and a delivery port, an overhead-transport-vehicle overhead track outside of a stocker area and alongside the delivery port and a load port of a processing tool and extending to a stocker area, an overhead transport vehicle to transport the article between the delivery port and the load port, and a joint track. A crane runner can enter the overhead-transport-vehicle overhead track from the crane overhead track via the joint track to the stocker area.

10 Claims, 12 Drawing Sheets

(56) References Cited

U.S. PATENT DOCUMENTS

| | | | |
|---|---|---|---|
| 2010/0242783 A1* | 9/2010 | Oguro | H01L 21/6773 104/91 |
| 2015/0329298 A1* | 11/2015 | Ito | H01L 21/67733 414/222.07 |
| 2016/0272468 A1* | 9/2016 | Izumi | B66C 9/02 |
| 2017/0233188 A1* | 8/2017 | Tai | B65G 1/0492 414/281 |

* cited by examiner

TRANSPORT SYSTEM AND TRANSPORT METHOD

BACKGROUND OF THE INVENTION

1. Field of the Invention

The present invention relates to a transport system and a transport method.

2. Description of the Related Art

Manufacturing facilities, such as semiconductor fabrication facilities, include a stocker that stores articles such as front opening unified pods (FOUPs) that contain semiconductor wafers or reticle pods that contain reticles. The stocker includes a crane that transfers the articles between a plurality of storage shelves and a delivery port. Examples of the crane include a suspension crane that moves along a track mounted on the ceiling. To increase efficiencies in transferring articles, a conventional technique discloses a configuration in which two types of suspension cranes run on a common track (see, for example, International Publication No. 2016/178347).

In a stocker described in International Publication No. 2016/178347, two types of suspension cranes run on a common track and travel within a single stocker area in which the stocker is disposed. When the suspension cranes move to another stocker area or to a maintenance area to receive maintenance work, the suspension cranes need to be detached from the track and carried to the area. Detaching a suspension crane from the track requires much effort and time and increases workers' workload. Moreover, the detached suspension crane is carried by a dedicated carrier, which leads to additional costs and time in transporting the crane.

SUMMARY OF THE INVENTION

Preferred embodiments of the present invention provide transport systems and transport methods that each enable an easy transfer of a suspension crane between a stocker area and a predetermined area without using a dedicated carrier.

A transport system according to a preferred embodiment of the present invention includes a stocker, an overhead-transport-vehicle overhead track, an overhead transport vehicle, and a joint track. The stocker includes a plurality of storages arranged in a vertical direction to store therein an article, a delivery port to which the article is passed or from which the article is received, a crane overhead track disposed alongside the storages and the delivery port, and a suspension crane including a crane runner that runs along the crane overhead track, a mast hanging down from the crane runner, and an article transferor that moves upward or downward by being guided by the mast. The suspension crane transports the article between the storages and the delivery port. The stocker is disposed in a stocker area. The overhead-transport-vehicle overhead track is disposed outside of the stocker area and extends alongside the delivery port and a load port of a processing tool to a predetermined area. The overhead transport vehicle includes a transport vehicle runner that runs along the overhead-transport-vehicle overhead track and an article holder that holds the article and moves upward or downward. The overhead transport vehicle transports the article between the delivery port and the load port. The joint track connects the crane overhead track with the overhead-transport-vehicle overhead track. The crane runner can enter the overhead-transport-vehicle overhead track from the crane overhead track via the joint track and can run on the overhead-transport-vehicle overhead track to the predetermined area, or can enter the overhead-transport-vehicle overhead track from the predetermined area and run to the joint track, and can enter and run on the crane overhead track via the joint track.

Shapes of cross-sections across the crane overhead track, the overhead-transport-vehicle overhead track, and the joint track and orthogonal to directions in which the crane runner runs, respectively, may be identical or substantially identical to each other. Each of the crane runner and the transport vehicle runner may include a wheel and a runner main body to which the wheel is mounted, the wheel and the runner main body of the crane runner being identical to those of the transport vehicle runner, respectively. When the overhead transport vehicle starts running by driving the transport vehicle runner after a period of stopping, the overhead transport vehicle may raise the article holder to an uppermost position and start running. The crane overhead track may be disposed above a worker prohibited area into which workers are prohibited from entering; the overhead-transport-vehicle overhead track may be disposed above a worker passage in which workers are permitted to walk; when the suspension crane enters the overhead-transport-vehicle overhead track, workers may be prohibited from entering the worker passage through which the mast passes. The predetermined area may be another stocker area in which another stocker different from the above-mentioned stocker is disposed.

The overhead-transport-vehicle overhead track may include a first intrabay circling track, a second intrabay circling track, a first interbay track connected to first ends of the first intrabay circling track and the second intrabay circling track, and a second interbay track connected to second ends of the first intrabay circling track and the second intrabay circling track; the crane overhead track of the stocker may be connected to the first interbay track via a first one of the joint track; the crane overhead track of the other stocker may be connected to the second interbay track via a second one of the joint track. The predetermined area may be a maintenance area. The predetermined area may include an initial entrance for the suspension crane.

A transport method according to a preferred embodiment of the present invention is used in a transport system including a stocker, an overhead-transport-vehicle overhead track, an overhead transport vehicle, and a joint track. The stocker includes a plurality of storages arranged in a vertical direction to store therein an article, a delivery port to which the article is passed or from which the article is received, a crane overhead track disposed alongside the storages and the delivery port, and a suspension crane including a crane runner that runs along the crane overhead track, a mast hanging down from the crane runner, and an article transferor that moves upward or downward by being guided by the mast. The suspension crane transports the article between the storages and the delivery port. The stocker is disposed in a stocker area. The overhead-transport-vehicle overhead track is disposed outside of the stocker area and extends alongside the delivery port and a load port of a processing tool to a predetermined area. The overhead transport vehicle includes a transport vehicle runner that runs along the overhead-transport-vehicle overhead track and an article holder that holds the article and moves upward or downward. The overhead transport vehicle transports the article between the delivery port and the load port. The joint track connects the crane overhead track with the overhead-transport-vehicle overhead track. The transport method includes causing the crane runner to enter the overhead-transport-vehicle overhead track from the crane overhead track via the joint track and run on the overhead-transport-vehicle overhead track to the predetermined area, or causing the crane runner to enter the overhead-transport-vehicle overhead track from the predetermined area and run to the joint track, and enter and run on the crane overhead track via the joint track.

With the transport systems and the transport methods according to preferred embodiments of the present invention, the suspension crane, which ordinarily runs on the crane overhead track in the stocker area and transfers the article between the storages and the delivery port in the stocker area, can move to a predetermined area outside of the stocker area through the joint track and the overhead-transport-vehicle overhead track as necessary. This configuration enables an easy transfer of the suspension crane between the stocker area and the predetermined area in a shorter time without using a dedicated carrier and eliminates time-consuming work of detaching the suspension crane from the track. In addition, this configuration eliminates the need for using a carrier dedicated to carrying the detached suspension crane, thus preventing cost increase.

When shapes of cross-sections across the crane overhead track, the overhead-transport-vehicle overhead track, and the joint track and orthogonal to directions in which the crane runner runs, respectively, are identical or substantially identical to each other, these tracks can be standardized and installed at lower costs. When each of the crane runner and the transport vehicle runner include a wheel and a runner main body to which the wheel is mounted, the wheel and the runner main body of the crane runner being identical to those of the transport vehicle runner, respectively, the runners of the suspension crane and the overhead transport vehicle can be standardized and the crane runner and the transport vehicle runner can be manufactured at lower costs. When the overhead transport vehicle starts running by driving the transport vehicle runner after a period of stopping, and when the overhead transport vehicle raises the article holder to the uppermost position and starts running, components of the overhead transport vehicle can avoid contacting an obstacle below the overhead-transport-vehicle overhead track while the overhead transport vehicle is running. The crane overhead track is disposed above the worker prohibited area and the overhead-transport-vehicle overhead track is disposed above the worker passage. When the suspension crane enters the overhead-transport-vehicle overhead track and workers are prohibited from entering the worker passage through which the mast passes, the suspension crane, which has been operating in the worker prohibited area into which the workers are prohibited from entering, can be moved properly through the overhead-transport-vehicle track disposed above the worker passage in which the workers are usually permitted to walk.

When the predetermined area is another stocker area in which another stocker different from the stocker is disposed, the suspension crane can be easily moved between the stocker area and the other stocker area. When the overhead-transport-vehicle overhead track includes the first intrabay circling track, the second intrabay circling track, the first interbay track, and the second interbay track, and when the crane overhead track of the stocker is connected to the first interbay track via the first joint track, and the crane overhead track of the other stocker is connected to the second interbay track via the second joint track, the suspension crane can be moved between the stocker and the other stocker through the first and the second intrabay circling tracks and the first and the second interbay tracks without trouble. When the predetermined area is a maintenance area, the suspension crane can be easily moved between the stocker area and the maintenance area. When the predetermined area includes the initial entrance for the suspension crane, the suspension crane can be moved from the initial entrance to the stocker areas. This structure eliminates an operation of attaching the suspension crane to the crane overhead track in each stocker and increases work efficiency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes preferred embodiments of the present invention with reference to the accompanying drawings. The preferred embodiments are not intended to limit the scope of the present invention. In the accompanying drawings, components may be partially enlarged or emphasized on different reduced scales as appropriate to describe the preferred embodiments.

Figure 1:
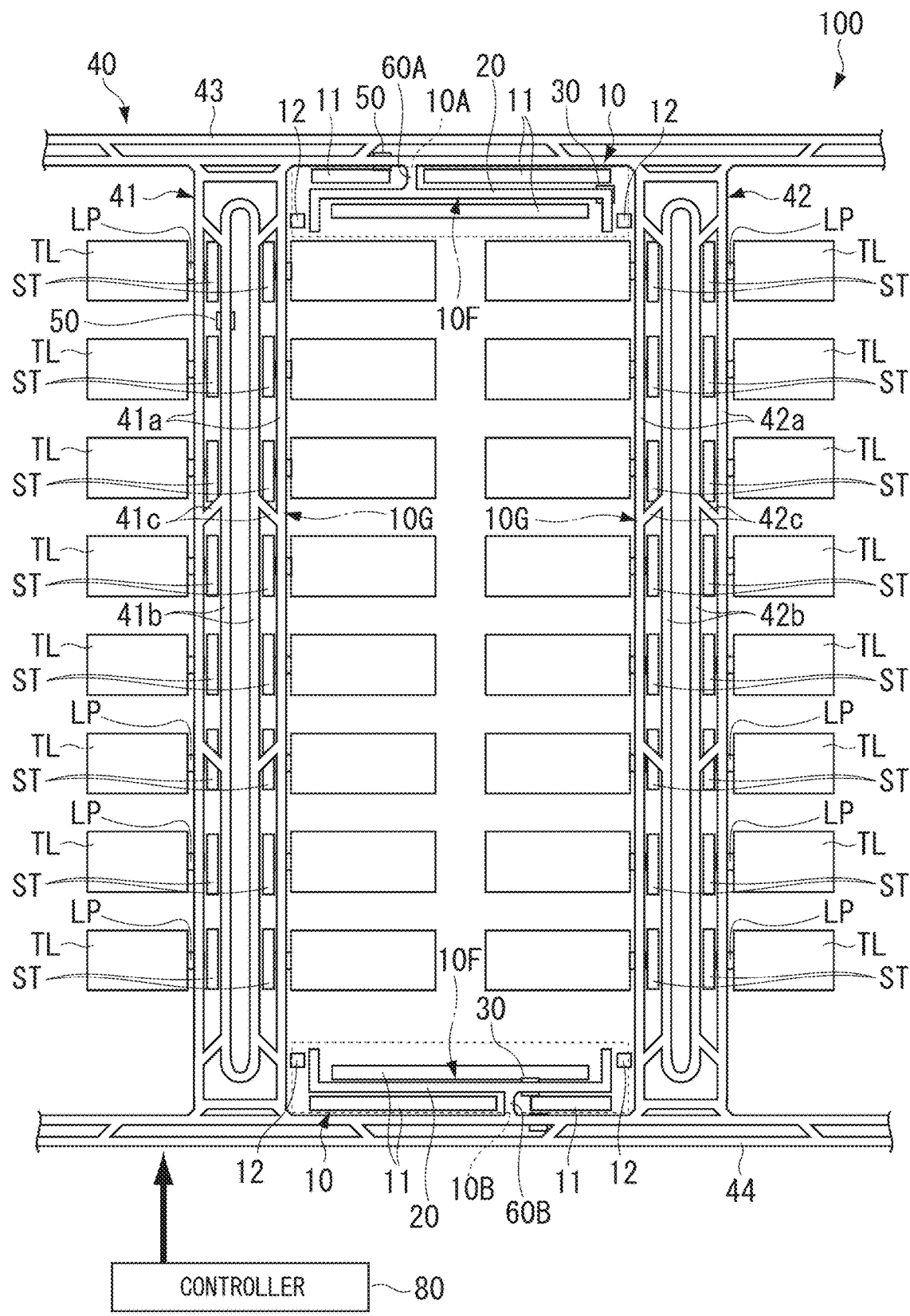
FIG. 1 is a plan view illustrating an example transport system according to a preferred embodiment of the present invention.

FIG. 1 is a plan view illustrating an example transport system 100 according to a present preferred embodiment. The transport system 100 illustrated in FIG. 1 is installed in, for example, a semiconductor device fabrication facility. The transport system 100 transports an article 2 such as a FOUP containing semiconductor wafers used to fabricate semiconductor devices or a reticle pod containing, for example, reticles. The article 2 is herein described as a FOUP, but the article 2 may be other than the FOUP. The transport system 100 may be applied to a facility in a field other than the semiconductor fabrication, and the article 2 may be other articles conveyed in a facility in which the transport system 100 is installed.

Figure 2:
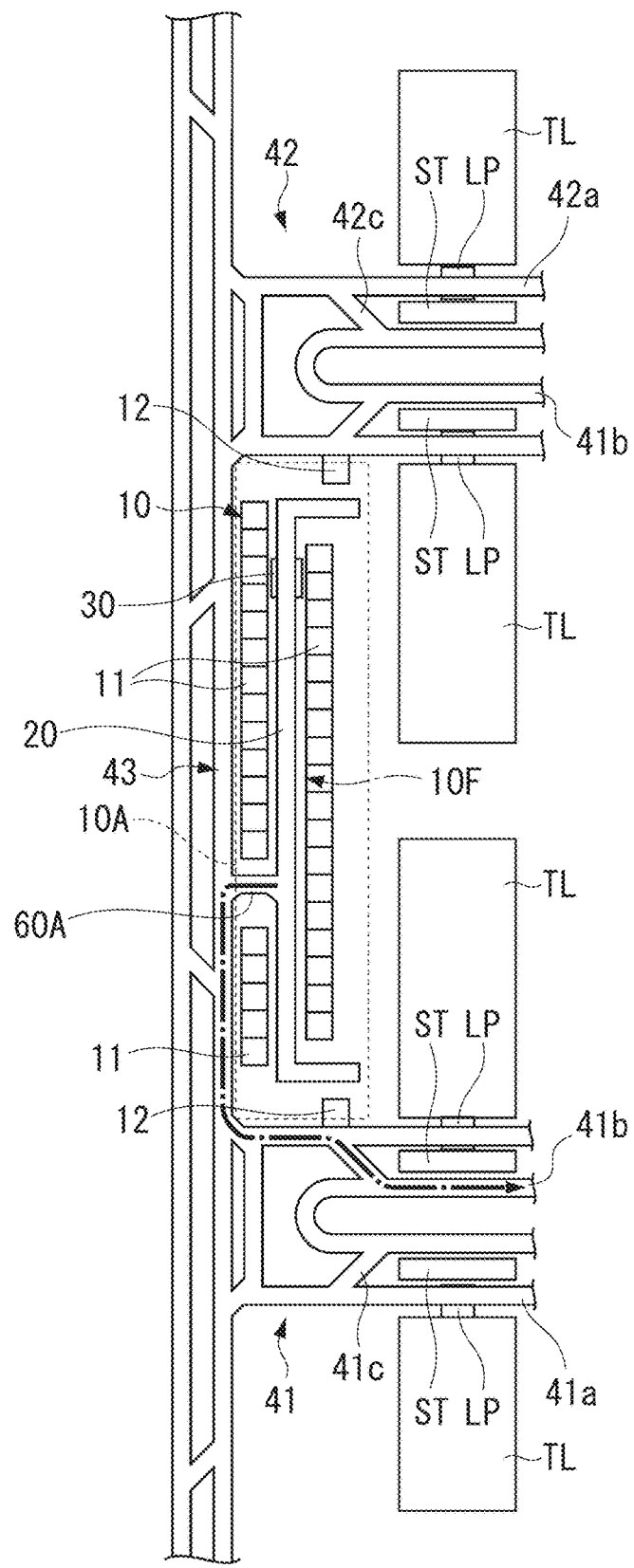
FIG. 2 is a plan view illustrating an enlarged stocker area illustrated in FIG. 1.

As illustrated in FIG. 1, the transport system 100 includes stockers 10, an overhead-transport-vehicle overhead track 40, an overhead transport vehicle 50, a first joint track 60A, a second joint track 60B, and a controller 80. The stockers 10 are disposed in a stocker area 10A and another stocker area (predetermined area) 10B. FIG. 2 is a diagram illustrating an example of the stocker area 10A. As illustrated in FIG. 2, the stocker 10 includes storages 11, delivery ports 12, a crane overhead track 20, and a suspension crane 30.

The storages 11 are arranged in the vertical direction and in the horizontal direction corresponding to the direction in which the suspension crane 30 runs. The storages 11 store therein articles 2. The storages 11 are, for example, shelves on which the articles 2 can be placed. Each shelf on which an article 2 is placed may have a plurality of pins that are inserted into recesses on the bottom surface of the article 2. When the pins are inserted in the recesses of the article 2, the article 2 is kept in position on the shelf. The storages 11 are disposed at three locations in each of the stocker areas 10A and 10B, but the number of locations is not limited thereto. The number of locations of the storages 11 may be optionally set. Each delivery port 12 is a place at which the article 2 is passed or received to or from, for example, the overhead transport vehicle 50. The delivery ports 12 are disposed at a plurality of locations in the stocker area 10A. The crane overhead track 20 is disposed alongside the storages 11 and the delivery ports 12. The crane overhead track 20 is disposed above a worker prohibited area 10F into which workers are prohibited from entering while the suspension crane 30 is operating. Workers may be prohibited from entering the entire stocker areas 10A and 10B while the suspension crane 30 is operating.

Figure 3:
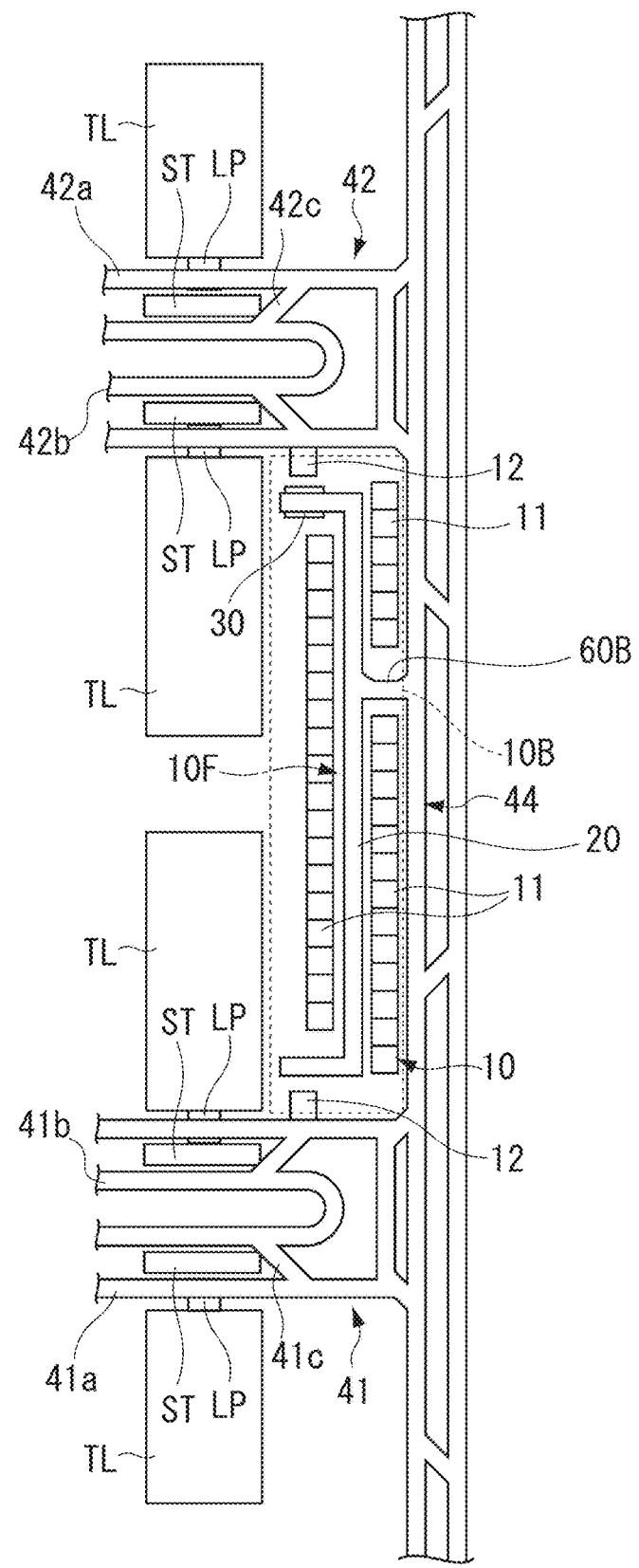
FIG. 3 is a plan view illustrating an enlarged predetermined area illustrated in FIG. 1.

FIG. 3 is a diagram illustrating an example of the predetermined area. The predetermined area illustrated in FIG. 3 is the other stocker area 10B located separately from the stocker area 10A. In the present preferred embodiment, as illustrated in FIG. 3, the stocker area 10B has the same configuration as the stocker area 10A but may have a different configuration. In the stocker area 10B, another stocker 10 is disposed. In the same manner as in the stocker area 10A, the other stocker 10 includes a plurality of storages 11, a plurality of delivery ports 12, a crane overhead track 20, and a suspension crane 30.

Figure 4:
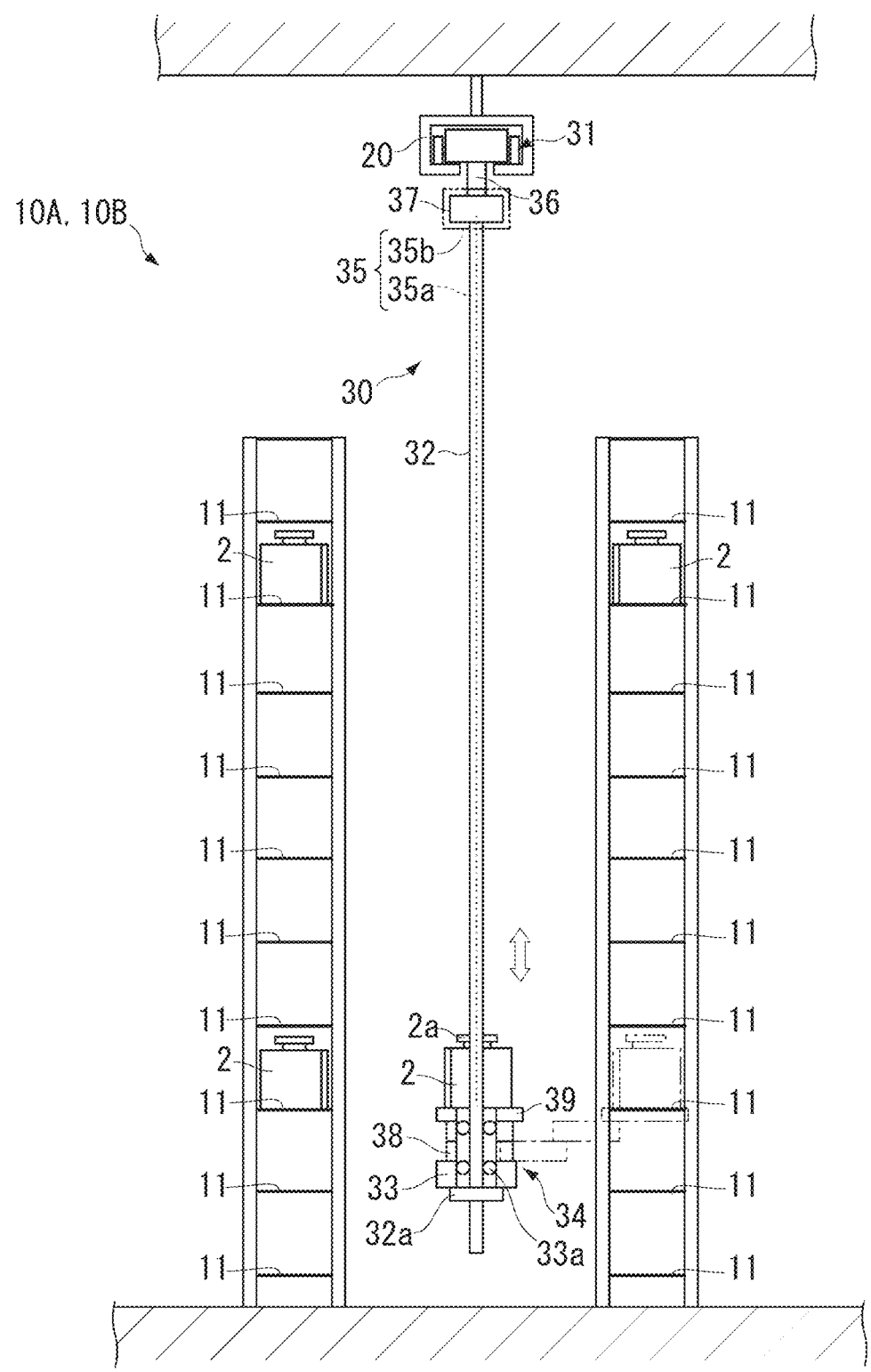
FIG. 4 is a diagram illustrating an example suspension crane.

The suspension crane 30 transports the article 2 between the storages 11 and the delivery ports 12. The suspension crane 30 transfers the article 2 from the current shelf to another shelf in the storages 11. FIG. 4 is a diagram illustrating an example of the suspension crane 30. As illustrated in FIG. 4, the suspension crane 30 includes a crane runner 31, a mast 32, and an article transferor 34. The article transferor 34 includes a lifting base 33 and a lifting driver 35. The crane runner 31 includes a running driver (not illustrated) and a plurality of wheels 71a (see FIG. 6) and runs along the crane overhead track 20. The running driver may be, for example, an electric motor disposed in the crane runner 31 to drive the wheels 71a or may be a linear motor and the crane overhead track 20.

The mast 32 hangs down from the crane runner 31 and extends in the vertical direction to guide the lifting base 33. The mast 32 is formed in a hollow or a solid stick-like shape and has a circular, oval, elongated circular, or polygonal (e.g., rectangular) cross section. The lower end of the mast 32 is spaced apart from the floor surface by a predetermined distance. In FIG. 4, an upper support 37 is mounted to the lower portion of the crane runner 31 via a mounter 36. The mast 32 is mounted to the lower surface of the upper support 37 and is suspended from the crane runner 31. To mount the mast 32 to the upper support 37, for example, fastening members such as bolts and nuts may be used, or other methods such as welding may be used. The suspension crane 30 may include a single mast 32 or include a plurality of masts 32 provided, for example, to the front and the rear of the crane runner 31 in the direction in which the crane runner 31 runs.

On the upper surface of the lifting base 33, the article transferor 34 is mounted, and the lifting base 33 can move upward or downward along the mast 32. The lifting base 33 includes guide rollers 33a that are disposed across the mast 32 to smoothly move the lifting base 33 upward or downward along the mast 32. A lower support 32a is mounted to a lower portion of the mast 32. The lifting base 33 can be lowered to the position abutting the lower support 32a. The lower support 32a is provided to prevent the lifting base 33 from falling off the mast 32.

The article transferor 34 is mounted on the lifting base 33 and is moved upward or downward with the guidance of the mast 32. The article transferor 34 includes an arm 38 and a table 39. The arm 38 can extend or retract in a direction orthogonal to the direction in which the crane runner 31 runs. The table 39 is disposed at the distal end of the arm 38, and the article 2 can be placed on the table 39. On receiving the article 2, the article transferor 34 extends the arm 38 to insert the table 39 below the article 2 and raises the lifting base 33 to place the article 2 on the table 39. Each storage 11 has a cut-out portion (not illustrated) through which the table 39 can pass in the vertical direction. The article transferor 34 then retracts the arm 38 with the article 2 being placed on the table 39, and moves the table 39, on which the article 2 is placed, back onto the lifting base 33.

On delivering the article 2 to a destination, the article transferor 34 extends the arm 38 to and above the destination to locate the table 39 above the destination. The lifting base 33 is then lowered and the table 39 passes through the cut-out portion of the storage 11, at which the article 2 is transferred from the table 39 to the destination. The article transferor 34 may have a configuration of gripping a flange 2a of the article 2 or a configuration of gripping the side surface of the article 2 instead of carrying the article 2 on the table 39.

The lifting driver 35 is, for example, a hoist and moves the lifting base 33 upward or downward along the mast 32. The lifting driver 35 includes a hanging member 35a and a driver 35b. The hanging member 35a is, for example, a belt or a wire, and the lifting base 33 is suspended by the hanging member 35a from the upper support 37. The driver 35b is disposed in the upper support 37 and pays out and winds up the hanging member 35a. When the driver 35b pays out the hanging member, the lifting base 33 moves downward with the guidance of the mast 32. When the driver 35b winds up the hanging member 35a, the lifting base 33 moves upward with the guidance of the mast 32. The driver 35b is controlled by, for example, the controller 80 to move the lifting base 33 downward or upward at a predetermined speed. The driver 35b is controlled by, for example, the controller 80 to keep the lifting base 33 at a target height.

The lifting driver 35 is disposed in the upper support 37 (crane runner 31), but the location of the lifting driver 35 is not limited thereto. The lifting driver 35 may be disposed in, for example, the lifting base 33. As an example of the lifting driver 35 disposed in the lifting base 33, the lifting driver 35 may be, for example, a hoist in the lifting base 33 and may wind up or pay out a belt or a wire hanged down from the upper support 37 to move the lifting base 33 upward or downward. As another example, an electric motor that drives a pinion may be disposed in the lifting base 33, and the mast 32 may include a rack engaging the pinion. The electric motor may be driven to rotate the pinion to move the lifting base 33 upward or downward.

As illustrated in FIGS. 1 to 3, the overhead transfer vehicle track 40 is disposed outside of the stocker area 10A. The overhead-transport-vehicle overhead track 40 is disposed alongside load ports LP of processing tools TL and extends to the stocker area (predetermined area) 10B. The overhead-transport-vehicle overhead track 40 is disposed above a worker passage 10G in which workers are permitted to walk during the operation of the overhead transport vehicle 50, except when the suspension crane 30 enters and runs on the overhead-transport-vehicle overhead track 40. The crane runner 31 of the suspension crane 30 can run on the overhead-transport-vehicle overhead track 40. This configuration can properly transfer the suspension crane 30 that has been operating in the worker prohibited area 10F into which workers are prohibited from entering through the overhead-transport-vehicle overhead track 40 disposed above the worker passage 10G in which the workers are permitted to walk.

The overhead-transport-vehicle overhead track 40 includes a first intrabay circling track 41, a second intrabay circling track 42, a first interbay track 43, and a second interbay track 44. The first intrabay circling track 41 and the second intrabay circling track 42 are spaced apart by a distance corresponding to the size of the stocker area 10A and the stocker area 10B and are parallel or substantially parallel to each other. Walls (not illustrated) surround the stocker areas 10A and 10B along the outer circumference. The walls divide the inside and the outside of the stocker areas 10A and 10B. While the suspension crane 30 is operating, workers are prohibited from entering the stocker areas 10A and 10B. When the suspension crane 30 is moved from the stocker areas 10A and 10B to a predetermined area, portions of the walls corresponding to joint tracks 60A and 60B are removed to allow the suspension crane 30 to get out of the stocker areas 10A and 10B.

The first intrabay circling track 41 includes an outer track 41a and an inner track 41b. The outer track 41a has an annular shape. The opposite ends of the outer track 41a in the longitudinal direction are connected to the first interbay track 43 and the second interbay track 44, which will be described later. When seen in the plan view, the outer track 41a passes a side of a delivery port 12 in the stocker areas 10A and 10B. The overhead transport vehicle 50 running on the outer track 41a can pass or receive the article 2 to or from the delivery port 12. The outer track 41a is disposed immediately above the load ports LP of the processing tools TL. The inner track 41b has an annular shape and is disposed inside the outer track 41a.

The second intrabay circling track 42 includes an outer track 42a and an inner track 42b. The outer track 42a has an annular shape. The opposite ends of the outer track 42a in the longitudinal direction are connected to the first interbay track 43 and the second interbay track 44, which will be described later. When seen in the plan view, the outer track 42a passes a side of another delivery port 12 in the stocker areas 10A and 10B. This delivery port 12 is different from the delivery port 12 corresponding to the outer track 41a of the first intrabay circling track 41. The overhead transport vehicle 50 running on the outer track 42a can pass or receive the article 2 to or from the delivery port 12. The outer track 42a is disposed immediately above the load ports LP of the processing tools TL. The inner track 42b has an annular shape and is disposed inside the outer track 42a. When seen in the plan view, the inner tracks 41b and 42b are disposed at a position offset from the position immediately above the load ports LP. This configuration can prevent the mast 32 hanging down from the crane runner 31 from contacting the load ports LP when the suspension crane 30 moves from the stocker area 10A, which will be described later, to a predetermined area.

The inner track 41b is connected to the outer track 41a via connecting tracks 41c. The inner track 42b is connected to the outer track 42a via connecting tracks 42c. Between the outer track 41a and the inner track 41b and between the outer track 42a and the inner track 42b, a plurality of buffers ST are disposed along, for example, the outer tracks 41a and 42a. The buffers ST have, for example, a shelf on which the article 2 can be placed. The buffers ST are hanged from the ceiling of the facility. Providing the buffers ST is optional, and the buffers ST may be excluded.

The first interbay track 43 is connected to first ends of the first intrabay circling track 41 and the second intrabay circling track 42. The second interbay track 44 is connected to second ends of the first intrabay circling track 41 and the second intrabay circling track 42. The first interbay track 43 and the second interbay track 44 each include two linear tracks extending in parallel or substantially in parallel to each other. A plurality of connecting tracks are disposed between the two linear tracks.

The overhead transport vehicle 50 moves along the overhead-transport-vehicle overhead track 40 to deliver the article 2 between the load ports LP of the processing tools TL and the delivery ports 12 in the stocker areas 10A and 10B. The overhead transport vehicle 50 transfers the article 2 between the load ports LP, the delivery ports 12, and, in addition, the buffers ST disposed along the overhead-transport-vehicle overhead track 40 (outer tracks 41a and 42a, for example). Examples of the processing tools TL include an aligner, a coater/developer, a deposition tool, and an etching tool. The processing tools TL perform various types of processing on the semiconductor wafers contained in the article 2 transported by the transport system 100.

Figure 5:
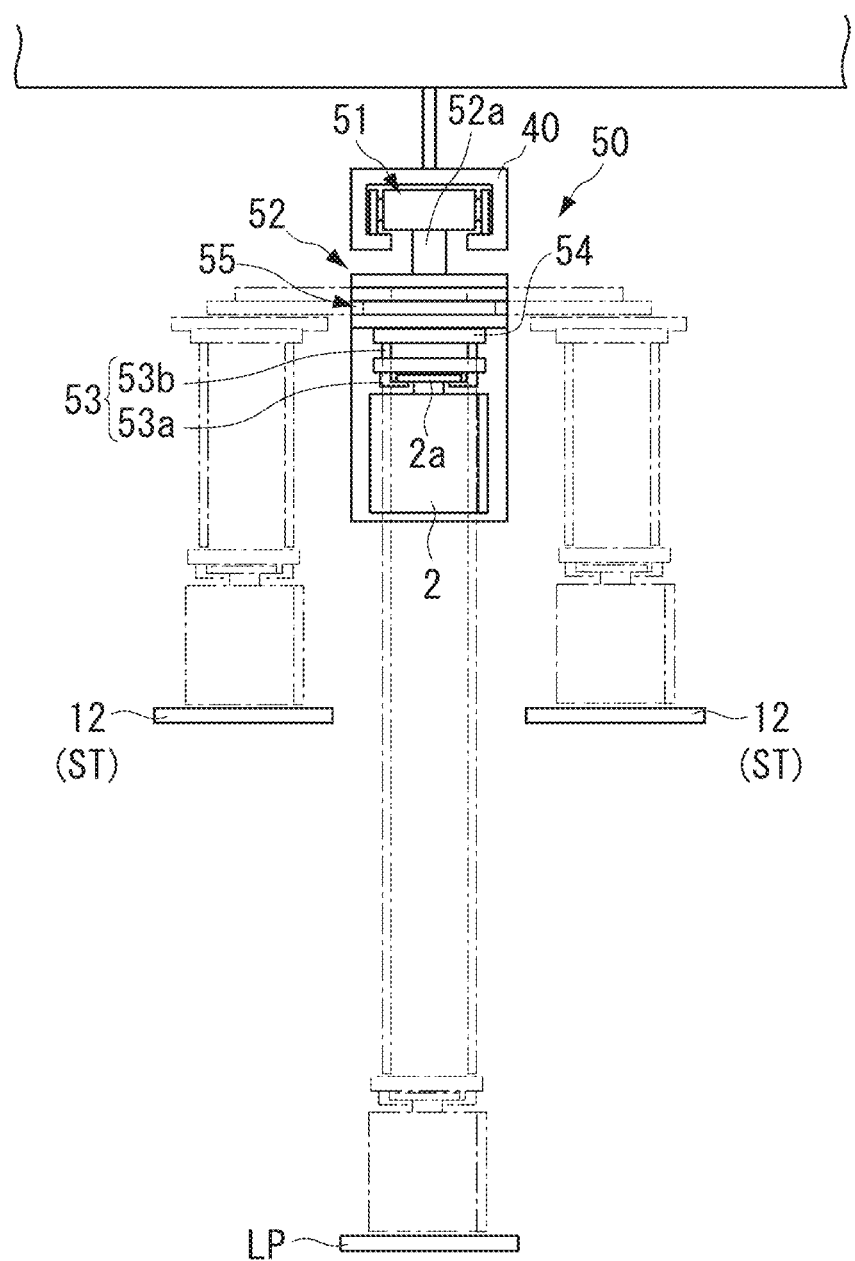
FIG. 5 is a diagram illustrating an example overhead transport vehicle.

FIG. 5 is a diagram illustrating an example of the overhead transport vehicle 50. As illustrated in FIG. 5, the overhead transport vehicle 50 includes a transport vehicle runner 51 and a main body 52. In the same manner as the crane runner 31, the transport vehicle runner 51 includes a running driver (not illustrated) and a plurality of wheels 71a (see FIG. 6) and runs along the overhead-transport-vehicle overhead track 40. The running driver may be, for example, an electric motor disposed in the transport vehicle runner 51 to drive the wheels 71a or may be a linear motor and the overhead-transport-vehicle overhead track 40.

The main body 52 is mounted to a lower portion of the transport vehicle runner 51 via a mounter 52a. The main body 52 includes an article holder 53 that holds and hangs the article 2, a lifting driver 54 that moves the article holder 53 upward or downward in the vertical direction, and a horizontally moving structure 55 that moves the lifting driver 54. The article holder 53 holds and hangs the article 2 by gripping the flange 2a of the article 2. The article holder 53 is, for example, a chuck including jaws 53a that are movable in the horizontal direction. The jaws 53a are inserted under the flange of the article 2. The article holder 53 is then raised to hold the article 2. The article holder 53 is connected to a hanging member 53b such as a wire or a belt. The overhead transport vehicle 50 has no guiding structure, such as the mast 32 of the suspension crane 30, for use in raising or lowering the article holder 53. In this regard, the article holder 53 is swingable relative to the main body 52.

The lifting driver 54 is, for example, a hoist. The lifting driver 54 lowers the article holder 53 by paying out the hanging member 53b and raises the article holder 53 by winding up the hanging member 53b. The lifting driver 54 is controlled by, for example, the controller 80 to move the article holder 53 downward or upward at a predetermined speed. The lifting driver 54 is controlled by, for example, the controller 80 to keep the article holder 53 at a target height. When the overhead transport vehicle 50 starts running by driving the transport vehicle runner 51 after a period of stopping, the overhead transport vehicle 50 raises the article holder 53 to the uppermost position using the lifting driver and starts running. This configuration can prevent components of the overhead transport vehicle 50 from contacting an obstacle below the overhead-transport-vehicle overhead track 40 while the overhead transport vehicle 50 is running.

The horizontally moving structure 55 includes, for example, movable plates stacked in the vertical direction. The movable plates can move laterally relative to the direction in which the transport vehicle runner 51 runs. To the movable plates, a rotator and the lifting driver 54 are mounted. The main body 52 includes, for example, a guide (not illustrated) that guides the horizontally moving structure 55 and a driver (not illustrated) that drives the horizontally moving structure 55. The horizontally moving structure 55 moves the lifting driver 54 and the article holder 53 between a projecting position and a stored position along the guide by the driving force from the driver such as an electric motor. The projecting position is a position projecting laterally from the main body 52. The stored position is a position stored in the main body 52.

The rotator includes a rotating member (not illustrated) and a rotation driver (not illustrated). The rotating member is rotatable about an axis extending in the vertical direction. The rotating member is connected to the lifting driver 54 or the article holder 53. The rotation driver is, for example, an electric motor and rotates the rotating member about the axis extending in the vertical direction. The rotary shaft is rotated by the driving force from the rotation driver and the rotator can rotate the lifting driver 54 or the article holder 53 about the axis extending in the vertical direction. The rotator can change the orientation of the article 2 held by the article holder 53. The overhead transport vehicle 50 may exclude the rotator.

Figure 6:
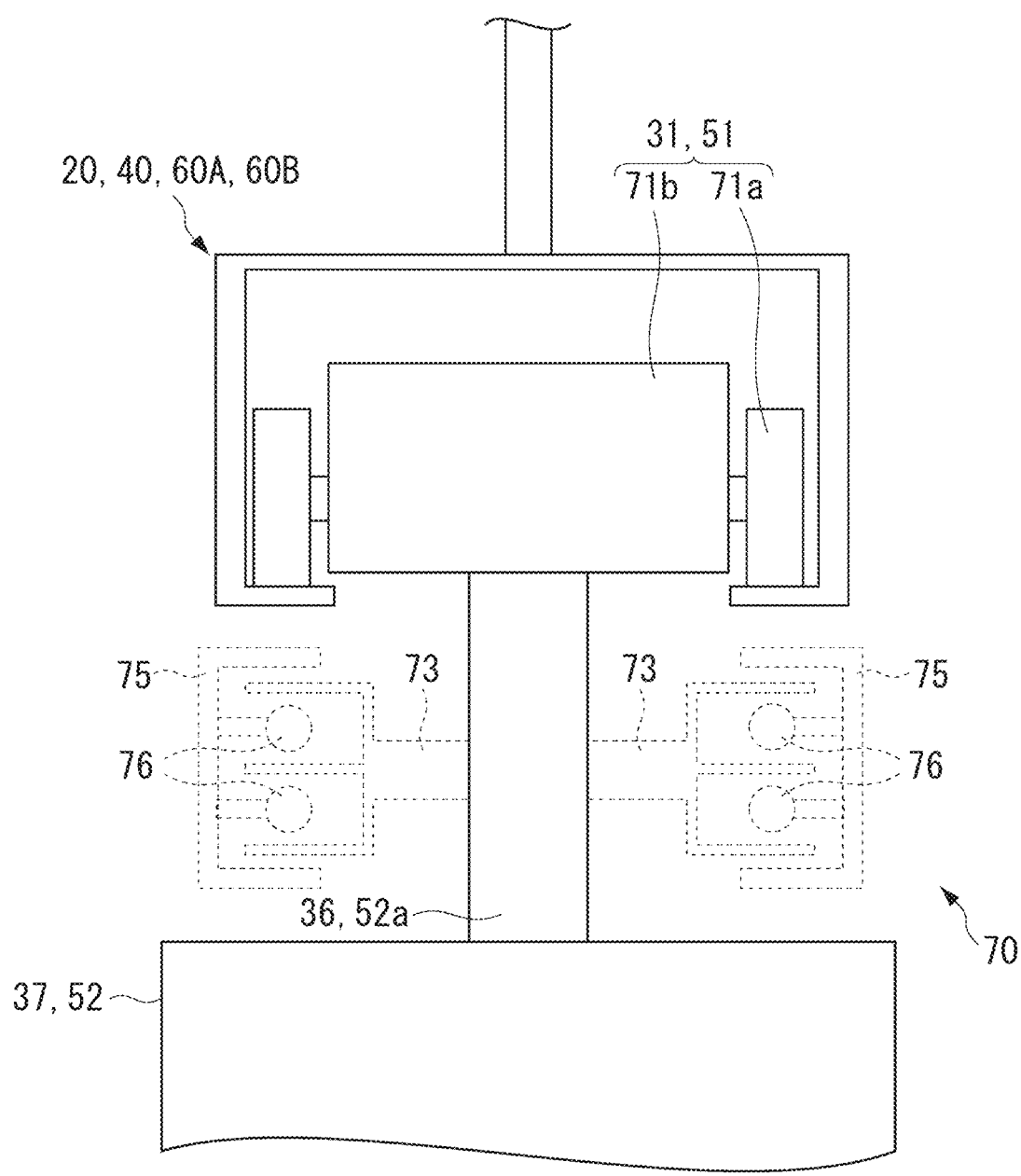
FIG. 6 is a diagram illustrating an example of a crane runner and a transport vehicle runner.

FIG. 6 is a diagram illustrating an example of the crane runner 31 and the transport vehicle runner 51. The crane runner 31 and the transport vehicle runner 51 have, for example, a common (an identical or substantially identical) structure. Cross-sections of the crane overhead track 20 and the overhead-transport-vehicle overhead track 40 taken on planes orthogonal to the directions thereof, respectively, are identical or substantially identical to each other. Thus, the crane runner 31 and the transport vehicle runner 51 can run on both tracks. Since the crane runner 31 and the transport vehicle runner 51 have a common structure, there is no need to manufacture the crane runner 31 or the transport vehicle runner 51 differently, and thus manufacturing costs of the suspension crane 30 and the overhead transport vehicle 50 can be reduced. A plurality of (e.g., two) crane runners 31A may be used for one suspension crane 30. In this case, the table 39 and the article 2, which are heavy, can be properly held via the mast 32.

The crane runner 31 and the transport vehicle runner 51 include identical wheels 71a and an identical runner main body 71b to which the wheels 71a are mounted. The wheels 71a abut lower inner surfaces of the crane overhead track 20 or the overhead-transport-vehicle overhead track 40. The runner main body 71b to which the wheels 71a are mounted includes a running driver that drives the wheels 71a or includes sensors. The crane overhead track 20 and the overhead-transport-vehicle overhead track 40 include a power supplier 70. The power supplier 70 includes power supply rails 75 and non-contact power supply wires 76 disposed in the power supply rails 75. The power supplier 70 is disposed below the crane overhead track 20 and the overhead-transport-vehicle overhead track 40 and is continuously or intermittently provided along the crane overhead track 20 and the overhead-transport-vehicle overhead track 40. Power receivers 73 are provided to the mounter 36 of the suspension crane 30 and to the mounter 52a of the overhead transport vehicle 50. The power receivers 73 receive electric power via the non-contact power supply wires 76 and supply power to, for example, the runner main body 71b.

As illustrated in FIG. 1, the controller 80 collectively controls the transport system 100. The controller 80 controls the operation of the suspension crane 30 and the overhead transport vehicle 50 by wireless or wired communication. The controller 80 may be separated into a controller controlling the suspension crane 30 and a controller controlling the overhead transport vehicle 50. The controller for the suspension crane 30 may be separated into controllers each disposed in a stocker area 10A or 10B or may collectively control the stocker areas 10A and 10B. The controller that controls the overhead transport vehicle 50 may control a plurality of overhead transport vehicles 50 running in a predetermined area.

As illustrated in FIGS. 1 to 3, the first joint track 60A connects the crane overhead track 20 in the stocker area 10A with the first interbay track 43 of the overhead-transport-vehicle overhead track 40. The second joint track 60B connects the crane overhead track 20 in the stocker area 10B with the second interbay track 44 of the overhead-transport-vehicle overhead track 40. The crane runner 31 can run on the first joint track 60A and the second joint track 60B. The crane runner 31 of the suspension crane 30 can enter the overhead-transport-vehicle overhead track 40 from the crane overhead track 20 via the first joint track 60A and run to the other stocker area 10B. The crane runner 31 can enter and run on the crane overhead track 20 from the overhead-transport-vehicle overhead track 40 via the second joint track 60B.

The transport vehicle runner 51 may be able to run on the first joint track 60A and the second joint track 60B. Cross-sections of the first joint track 60A and the second joint track 60B taken on planes orthogonal to running directions of the crane runner 31, respectively, are identical or substantially identical to those of the crane overhead track 20 and the overhead-transport-vehicle overhead track 40 (see FIG. 6). In this regard, the crane runner 31 or the transport vehicle runner 51 can run on the first joint track 60A and the second joint track 60B smoothly. Designing the tracks to have the same cross-section can achieve standardization of the tracks and thus achieve low-cost installation of the tracks.

In the transport system 100 described above, the suspension crane 30 runs on the crane overhead track 20 in the stocker area 10A or 10B and transports the article 2 between the storages 11 and the delivery ports 12. The suspension crane 30, for example, receives the article 2 stored in a storage 11 using the article transferor 34 (see FIG. 4) and runs along the crane overhead track 20 to a delivery port 12, and then places the article 2 on the delivery port 12. When the article 2 is placed on the delivery port 12 by the overhead transport vehicle 50, the suspension crane 30 can run along the crane overhead track 20 to the delivery port 12 and receive the article 2 using the article transferor 34, and then run along the crane overhead track 20 to a storage 11 as the destination, and place the article 2 on the storage 11 using the article transferor 34.

In the transport system 100, when the article 2 is placed on the delivery port 12 by the suspension crane 30, the overhead transport vehicle 50 runs along the overhead-transport-vehicle overhead track 40 to the delivery port 12 in the stocker area 10A. The overhead transport vehicle 50 then holds the article 2 by using the article holder 53 (see FIG. 5) and runs on the overhead-transport-vehicle overhead track 40, and the overhead transport vehicle 50 can deliver the article 2 to a delivery port 12 in the other stocker area 10B, the load port LP of a processing tool TL, or a buffer ST and place the article 2 thereon. When the overhead transport vehicle 50 receives the article 2 from the delivery port 12 in the other stocker area 10B, the load port LP of a processing tool TL, or a buffer ST, the overhead transport vehicle 50 can run along the overhead-transport-vehicle overhead track 40 to the delivery port 12 in the stocker area 10A and place the article 2 on the delivery port 12.

When the overhead transport vehicle 50 is running on the first intrabay circling track 41, the overhead transport vehicle 50 when located on the outer track 41a can pass or receive the article 2 to or from the delivery port 12. On passing or receiving the article 2 to or from the delivery port 12, the overhead transport vehicle 50 moves the article holder 53 upward or downward with the lifting driver 54 being projected laterally relative to the outer track 41a by the horizontally moving structure 55 (see FIG. 5). The overhead transport vehicle 50 located on the outer track 41a can pass or receive the article 2 to or from the load port LP of the processing tools TL. On passing or receiving the article 2 to or from the load port LP, the overhead transport vehicle 50 moves the article holder 53 upward or downward with no or substantially no movements of the horizontally moving structure 55 (see FIG. 5).

The overhead transport vehicle 50 located on the outer track 41a or on the inner track 41b can pass or receive the article 2 to or from the buffers ST. On passing or receiving the article 2 to or from a buffer ST, the overhead transport vehicle 50 moves the article holder 53 upward or downward with the lifting driver 54 being projected laterally relative to the outer track 41a or the inner track 41b by the horizontally moving structure 55. The overhead transport vehicle 50 can pass or receive the article 2 to or from the buffer ST when it is located either on the outer track 41a or on the inner track 41b by changing the direction in which the lifting driver 54 is projected by the horizontally moving structure 55 (see FIG. 5). Passing or receiving the article 2 to or from the buffer ST may be limited to an occasion when the overhead transport vehicle 50 is located on the outer track 41a or on the inner track 41b.

FIGS. 7 to 10 are diagrams illustrating an example route taken by the suspension crane 30 in moving from the stocker area 10A to the stocker area 10B as a predetermined area. In the present preferred embodiment, when the suspension crane 30 is moved from the stocker area 10A to the other stocker area (predetermined area) 10B, the suspension crane 30 can move along the first joint track 60A, the second joint track 60B, and the overhead-transport-vehicle overhead track 40, without needing to detach the suspension crane 30 from the crane overhead track 20. In this case, the suspension crane 30 may be manually moved by, for example, a worker, or may be automatically moved by the controller 80 (see FIG. 1).

Figure 7:
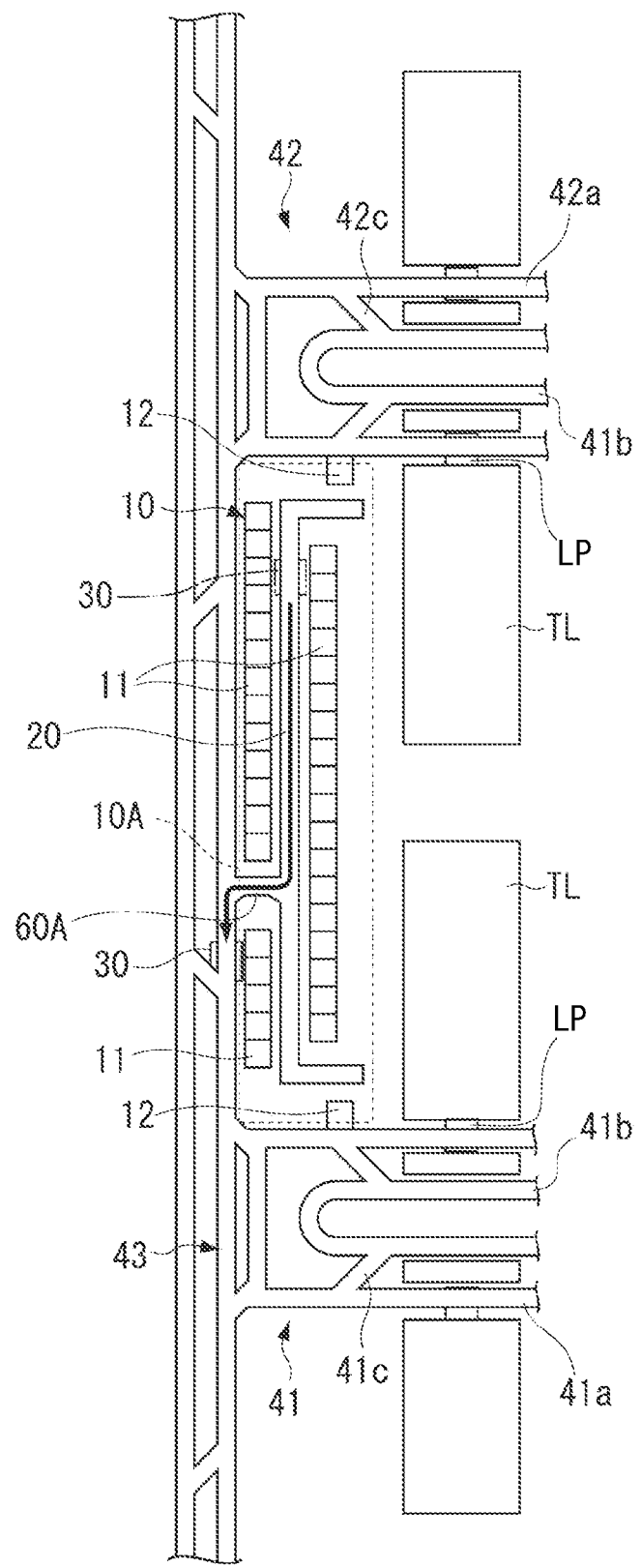
FIG. 7 is a diagram illustrating an example route taken by the suspension crane in moving from the stocker area to the predetermined area.

As illustrated in FIG. 7, the suspension crane 30 is located on the crane overhead track 20 in the stocker area 10A. First, the suspension crane 30 is moved from the crane overhead track 20 to the first interbay track 43 via the first joint track 60A (see the arrow in FIG. 7). This movement brings the suspension crane 30 from the inside of the stocker area 10A to the outside of the stocker area 10A. Machines that may interfere with the mast (see FIG. 4) are removed from the path taken by the suspension crane 30 when the suspension crane 30 runs on the overhead-transport-vehicle overhead track 40 to the other area. As described above, since the crane overhead track 20 and the first joint track 60A has the same cross-section, the crane runner 31 of the suspension crane 30 can smoothly enter the first joint track 60A from the crane overhead track 20.

Figure 8:
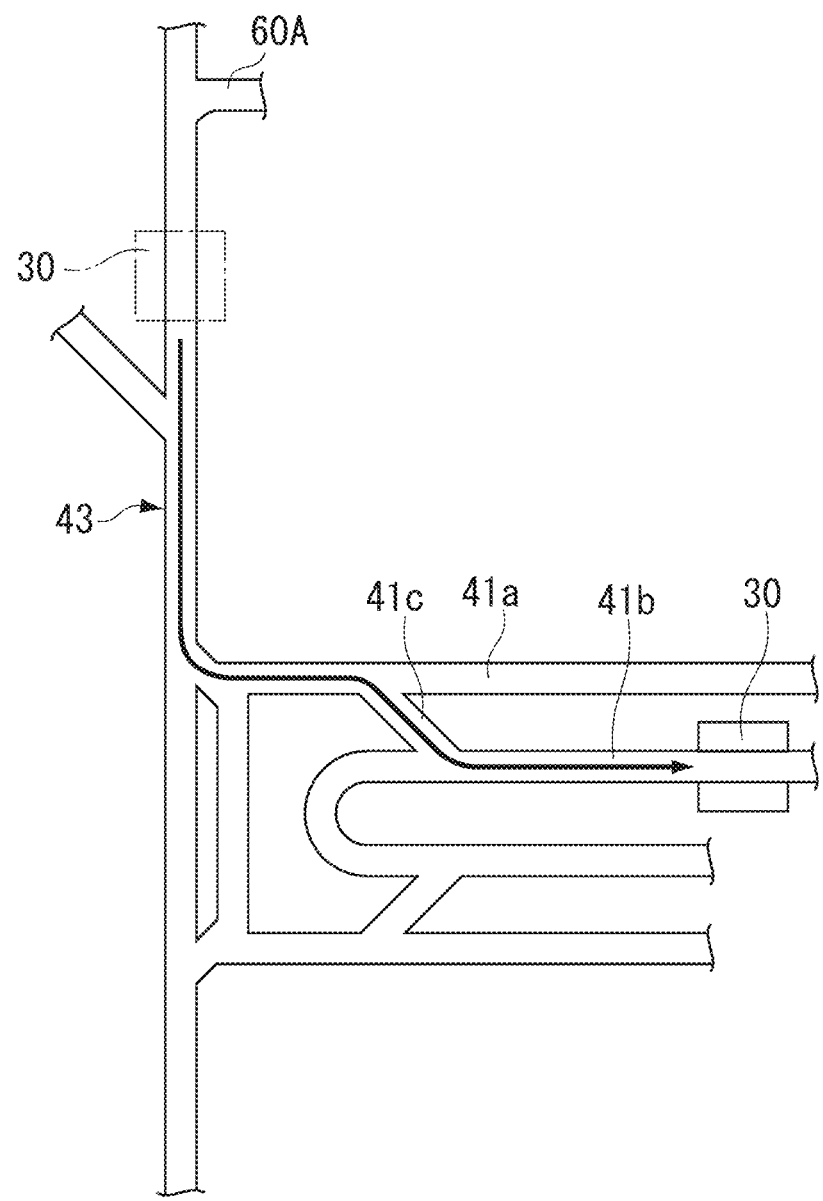
FIG. 8 is a diagram illustrating an example route taken by the suspension crane in moving from the stocker area to the predetermined area after the route illustrated in FIG. 7.

As illustrated in FIG. 8, the suspension crane 30 is then moved from the first interbay track 43 to the outer track 41a of the first intrabay circling track 41 and to the inner track 41b via a connecting track 41c (see the arrow in FIG. 8). The outer track 41a is disposed immediately above the load ports LP of the processing tools TL. If the suspension crane 30 keeps running on the outer track 41a, the mast 32 may contact the load ports LP. To prevent this situation, the suspension crane 30 is moved from the outer track 41a to the inner track 41b. The suspension crane 30 is then moved along the inner track 41b toward the stocker area 10B.

When the crane runner 31 runs on the inner track 41b (overhead-transport-vehicle overhead track 40), the mast 32 of the suspension crane 30 passes above the worker passage 10G. In this case, workers are prohibited from entering the worker passage 10G. To prevent the workers from entering the worker passage 10G, for example, a speaker provided on the suspension crane 30 or near the worker passage 10G may send out an alarming sound, or lamps provided near the worker passage 10G may be lit or blinked.

Figure 9:
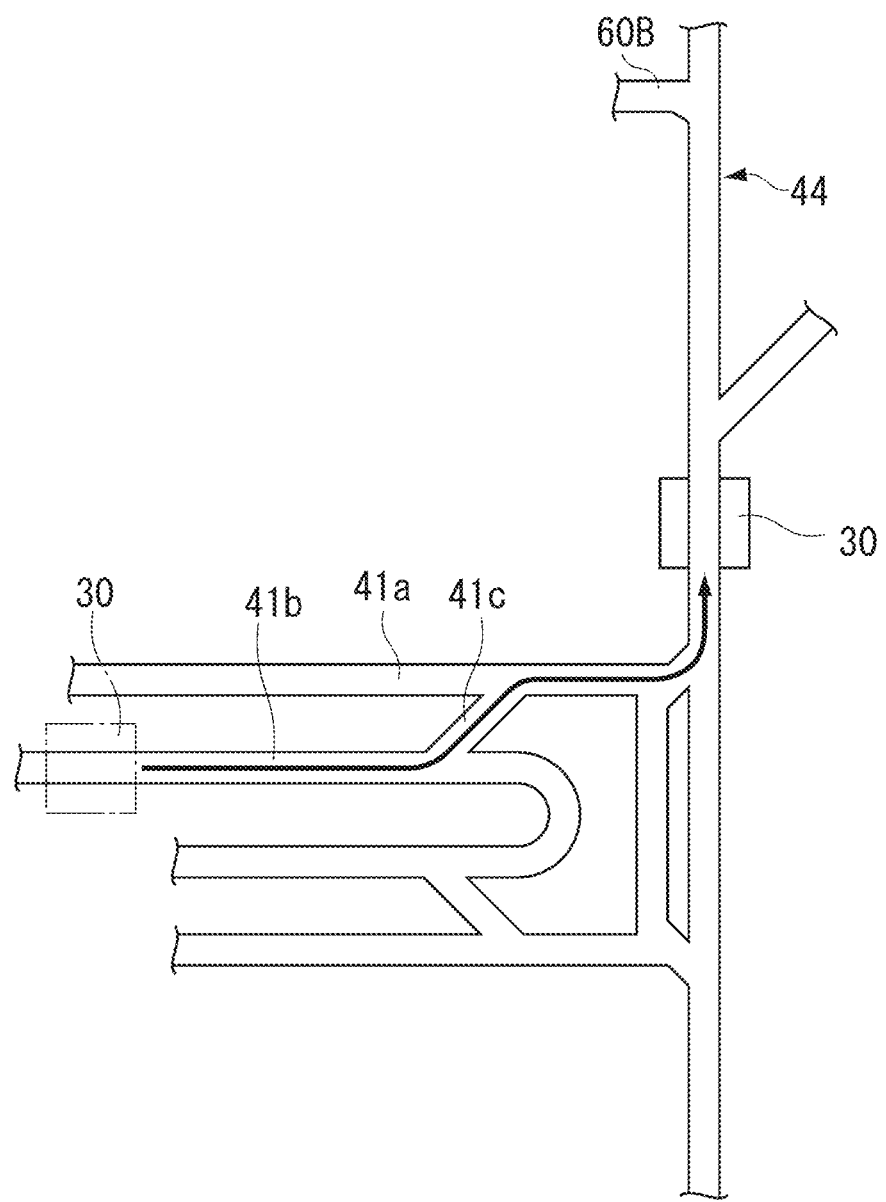
FIG. 9 is a diagram illustrating an example route taken by the suspension crane in moving from the stocker area to the predetermined area after the route illustrated in FIG. 8.

As illustrated in FIG. 9, the suspension crane 30 is then moved to an end portion of the inner track 41b and moved from the inner track 41b to the outer track 41a via another connecting track 41c. The suspension crane 30 is then moved from the outer track 41a to the second interbay track 44 and moved along the second interbay track 44 toward the stocker area 10B (see the arrow in FIG. 9).

Figure 10:
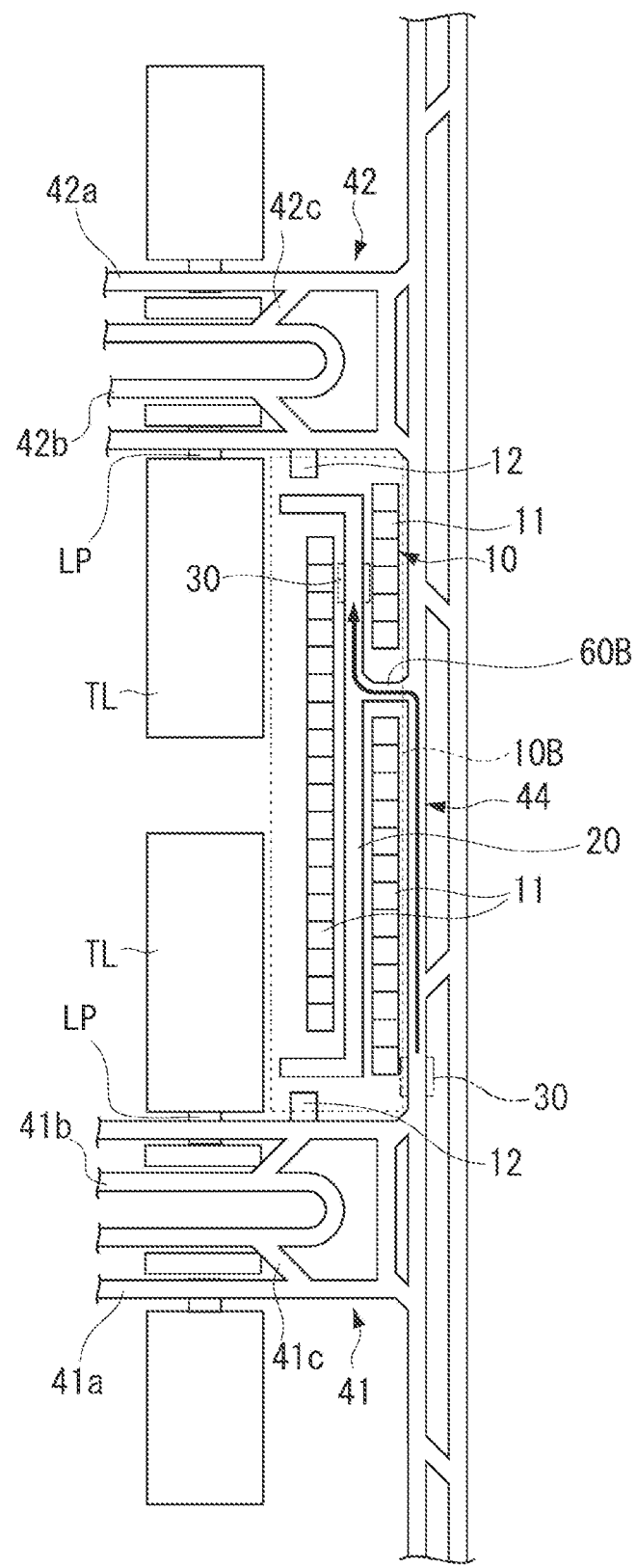
FIG. 10 is a diagram illustrating an example route taken by the suspension crane in moving from the stocker area to the predetermined area after the route illustrated in FIG. 9.

As illustrated in FIG. 10, the suspension crane 30 is then moved along the second interbay track 44 to the second joint track 60B and moved to the crane overhead track 20 in the stocker area 10B via the second joint track 60B (see the arrow in FIG. 10). Since the second interbay track 44, the second joint track 60B, and the crane overhead track 20 have the same cross-section, the crane runner 31 of the suspension crane 30 can smoothly enter the crane overhead track 20 from the second interbay track 44 via the second joint track 60B.

The suspension crane 30 preferably is included in the stocker 10 in the stocker area 10B and can deliver the article 2 between the storages 11 and the delivery ports 12 in the stocker area 10B. When the suspension crane 30 moves from the current track to the next track or moves along a curved track, the suspension crane 30 may slow down to prevent the hanging mast 32 from vibrating or swinging radially outward by, for example, the centrifugal force.

When the suspension crane 30 is moved from the stocker area 10B to the stocker area 10A, the suspension crane 30 is first moved from the crane overhead track 20 in the stocker area 10B to the second interbay track 44 via the second joint track 60B in the same manner as described above. The suspension crane 30 is then moved to the outer track 42a of the second intrabay circling track 42 and moved to the inner track 42b via a connecting track 42c. The suspension crane 30 is then moved to the outer track 42a from another connecting track 42c close to the first interbay track 43 and moved from the outer track 42a to the first interbay track 43. The suspension crane 30 is then moved from the first interbay track 43 to the crane overhead track 20 in the stocker area 10A via the first joint track 60A.

In the transport system 100 according to the present preferred embodiment, the suspension crane 30, which ordinarily runs on the crane overhead track 20 in the stocker area 10A and transports articles between the storages 11 and the delivery ports 12 in the stocker area 10A, can be moved to a predetermined area (stocker area 10B) outside of the stocker area 10A through the first joint track 60A, the second joint track 60B, and the overhead-transport-vehicle overhead track 40 as necessary. This configuration enables an easy transfer of the suspension crane 30 between the stocker area 10A and the predetermined area (stocker area 10B) in a shorter time without using a dedicated carrier. Accordingly, this configuration eliminates time-consuming work of detaching the suspension crane 30 from the track. In addition, this configuration eliminates the need for using a carrier dedicated to carry the detached suspension crane 30, thus preventing cost increase.

Figure 11:
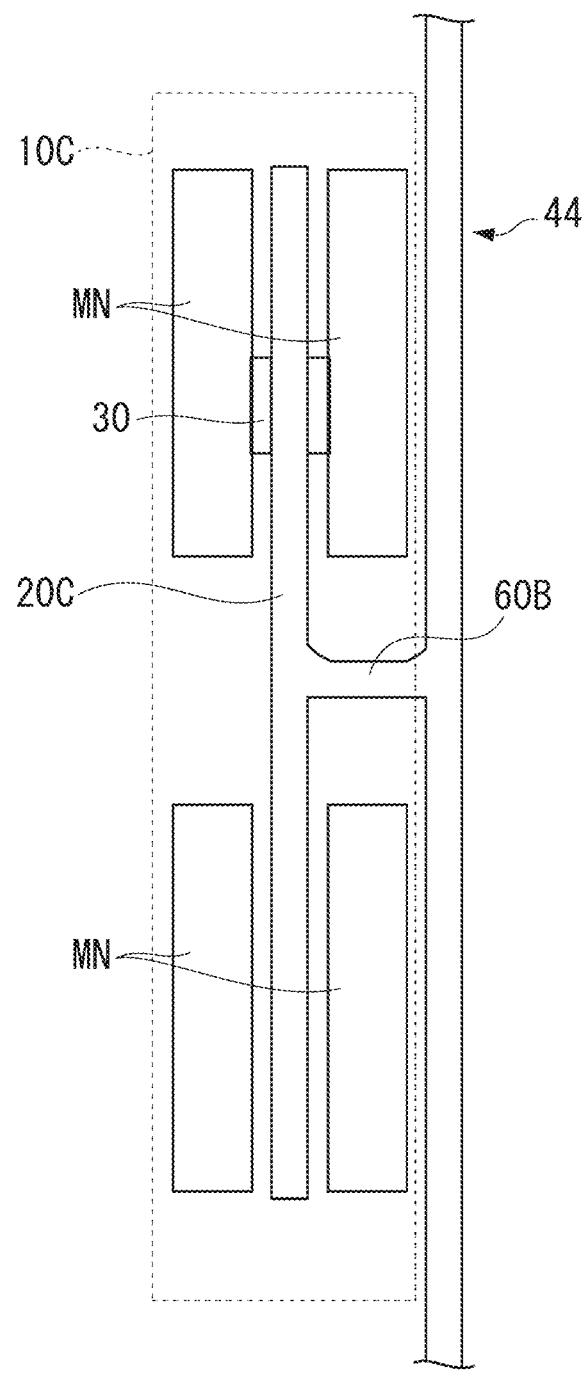
FIG. 11 is a plan view illustrating an example maintenance area as the predetermined area.
Figure 12:
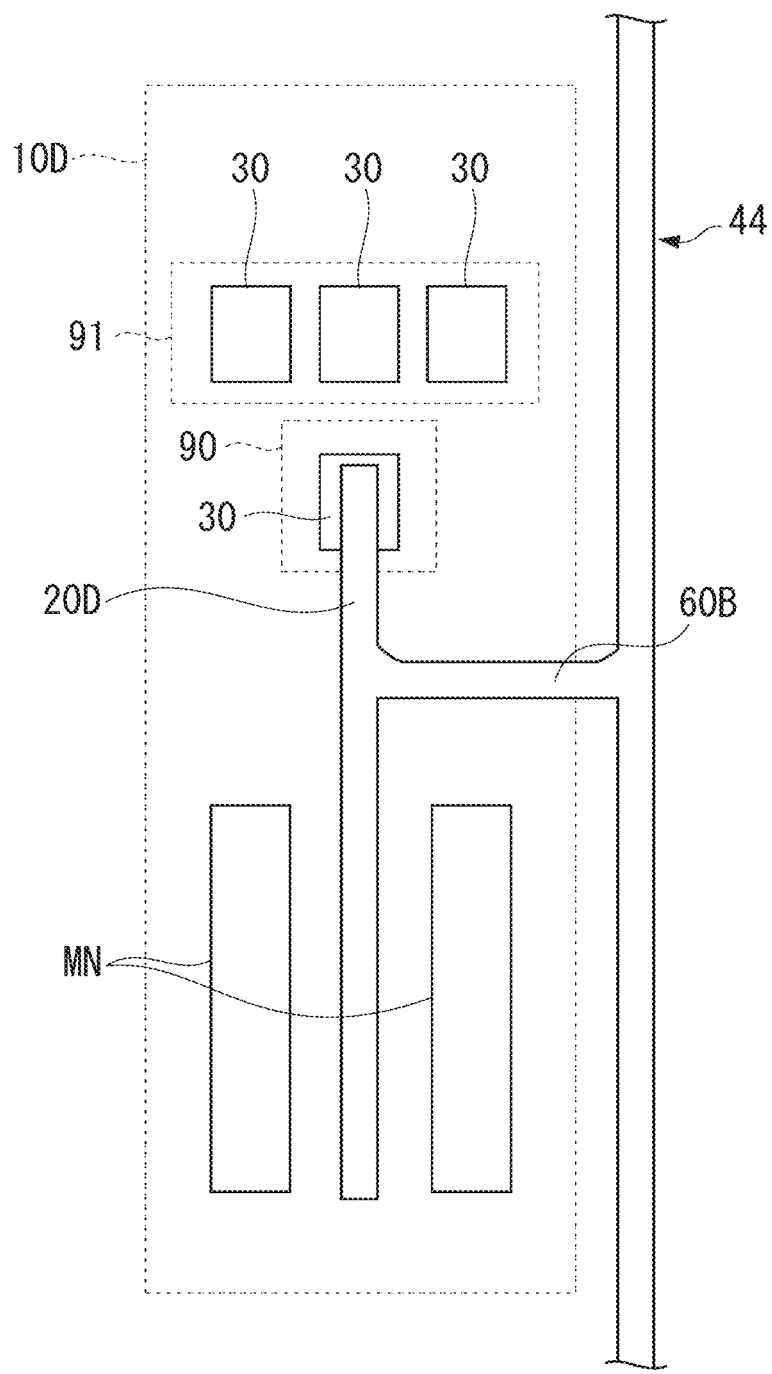
FIG. 12 is a plan view illustrating an example predetermined area including an initial entrance.

In the preferred embodiment above, the other stocker area 10B is described as an example of the predetermined area, but the predetermined area is not limited thereto. FIGS. 11 and 12 are diagrams illustrating other examples of the predetermined area. In the following description, components same as or similar to those described in the preferred embodiment above are similarly numbered and detailed description thereof is eliminated or simplified. As illustrated in FIG. 11, the predetermined area may be a maintenance area 10C. The maintenance area 10C includes a crane overhead track 20C and a plurality of maintenance devices MN. The maintenance devices MN are disposed along the crane overhead track 20C.

In this structure, when the suspension crane 30 is moved from the stocker area 10A to the maintenance area 100, in the same manner as described in the preferred embodiment above, the suspension crane 30 is moved from the stocker area 10A along the first interbay track 43, the first intrabay circling track 41, and the second interbay track 44, and to the crane overhead track 20C via the second joint track 60B close to the maintenance area 100. In the maintenance area 100, maintenance work may be performed on the suspension crane 30 hanged from the crane overhead track 20C or on the suspension crane 30 detached from the crane overhead track 20C. The maintenance work may be performed on the suspension crane 30 by using the maintenance devices MN or using other devices. When the maintenance devices MN are used to perform the maintenance work, the maintenance work may be automatically performed by, for example, the controller 80.

When the suspension crane 30 is moved from the maintenance area 100 to the stocker area 10A, in the same manner as described in the preferred embodiment above, the suspension crane 30 is moved along the crane overhead track 20C, the second joint track 60B, and the second interbay track 44 and through the second intrabay circling track 42 to the stocker area 10A. This configuration enables an easy transfer of the suspension crane 30 between the stocker area 10A and the maintenance area 100 and eliminates time-consuming and costly work of detaching the suspension crane 30 from the crane overhead track 20 and carrying for the maintenance work.

As illustrated in FIG. 12, a predetermined area 10D may include an initial entrance 90 for the suspension crane 30 and a crane storage 91 in which a plurality of suspension cranes 30 are stored. In the predetermined area 10D, maintenance devices MN are disposed. Instead of the maintenance devices MN, storages 11 or another crane storage 91 may be disposed. The crane storage 91 stores therein a plurality of operable suspension cranes 30 in a stand-by state. The predetermined area 10D may store a suspension crane 30 on which maintenance work is completed.

The initial entrance 90 is disposed at an end of a crane overhead track 20D in the predetermined area 10D. At the initial entrance 90, the suspension crane 30 is held and lifted by, for example, a lifter, to engage the crane runner 31 with the crane overhead track 20D. The suspension crane 30 is thus introduced into the crane overhead track 20D. The suspension crane 30 introduced in the crane overhead track 20D is moved from the crane overhead track 20D to the second interbay track 44 via the second joint track 60B, and in the same manner as described in the preferred embodiment above, the suspension crane 30 is moved through the second intrabay circling track 42 to the stocker area 10A. The suspension crane 30 can be used in the stocker area 10A in this manner.

When the predetermined area 10D includes the initial entrance 90 for the suspension crane 30 and the suspension crane 30 is moved from the initial entrance 90 to the stocker area 10A, the operation of attaching the suspension crane 30 to the crane overhead track 20 can be eliminated in each stocker 10 and this configuration can increase worker convenience.

Preferred embodiments of the present invention have been described above, but the present invention is not limited to the description above and various modifications may be made without departing from the scope of the present invention. In the preferred embodiments above, for example, when the suspension crane 30 is moved from the stocker area 10A to a predetermined area (10B, 10C, 10D), the suspension crane 30 takes the first intrabay circling track 41, and when the suspension crane 30 is moved from the predetermined area to the stocker area 10A, the suspension crane 30 takes the second intrabay circling track 42, but the suspension crane 30 is not limited thereto. For example, when the suspension crane 30 is moved from the stocker area 10A to a predetermined area (10B, 10C, 10D), the suspension crane 30 may take the second intrabay circling track 42, and when the suspension crane 30 is moved from the predetermined area to the stocker area 10A, the suspension crane 30 may take the first intrabay circling track 41. The suspension crane 30 may take the same intrabay circling track in both cases when moved from the stocker area 10A to a predetermined area (10B, 10C, 10D) and moved from the predetermined area to the stocker area 10A.

Japanese Patent Application No. 2017-128569 and all the literature cited anywhere in this description are hereby incorporated by reference to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A transport system comprising:
a stocker including a plurality of storages each arranged in a vertical direction to store therein an article, a delivery port to which the article is passed or from which the article is received, a crane overhead track disposed alongside the storages and the delivery port, and a suspension crane including a crane runner that runs along the crane overhead track, a mast hanging down from the crane runner, and an article transferor movable upward or downward by being guided by the mast, the suspension crane being capable of transporting the article between the storages and the delivery port, the stocker being disposed in a stocker area;
an overhead-transport-vehicle overhead track disposed outside of the stocker area and extending along the delivery port and a load port of a processing tool to a predetermined area;
an overhead transport vehicle including a transport vehicle runner that runs along the overhead-transport-vehicle overhead track and an article holder that holds the article and moves upward or downward to transport the article between the delivery port and the load port; and
a joint track that connects the crane overhead track with the overhead-transport-vehicle overhead track; wherein
the crane runner is able to enter the overhead-transport-vehicle overhead track from the crane overhead track via the joint track and run on the overhead-transport-vehicle overhead track to the predetermined area, or able to enter the overhead-transport-vehicle overhead track from the predetermined area and run to the joint track and enter and run on the crane overhead track via the joint track.

2. The transport system according to claim 1, wherein shapes of cross-sections across the crane overhead track, the overhead-transport-vehicle overhead track, and the joint track and perpendicular or substantially perpendicular to directions in which the crane runner runs, respectively, are identical or substantially identical to each other.

3. The transport system according to claim 1, wherein the crane runner and the transport vehicle runner include an identical wheel and an identical runner main body to which the wheel is mounted.

4. The transport system according to claim 1, wherein, when the overhead transport vehicle starts running by driving the transport vehicle runner after a period of stopping, the overhead transport vehicle raises the article holder to an uppermost position and starts running.

5. The transport system according to claim 4, wherein
the crane overhead track is disposed above a worker prohibited area through which the mast of the suspension crane passes and into which workers are prohibited from entering;
the overhead-transport-vehicle overhead track is disposed above a worker passage in which workers are permitted to walk; and
when the suspension crane enters the overhead-transport-vehicle overhead track, workers are prohibited from entering the worker passage through which the mast passes.

6. The transport system according to claim 1, wherein the predetermined area is another stocker area in which another stocker different from the stocker is disposed.

7. The transport system according to claim 6, wherein
the overhead-transport-vehicle overhead track includes a first intrabay circling track, a second intrabay circling track, a first interbay track connected to first ends of the first intrabay circling track and the second intrabay circling track, and a second interbay track connected to second ends of the first intrabay circling track and the second intrabay circling track; and
the crane overhead track of the stocker is connected to the first interbay track via a first one of the joint track and the crane overhead track of the other stocker is connected to the second interbay track via a second one of the joint track.

8. The transport system according to claim 1, wherein the predetermined area is a maintenance area.

9. The transport system according to claim 1, wherein the predetermined area includes an initial entrance for the suspension crane.

10. A transport method for a transport system comprising:
providing the transport system with a stocker including a plurality of storages arranged in a vertical direction to store therein an article, a delivery port to which the article is passed or from which the article is received, a crane overhead track disposed along the storages and the delivery port, and a suspension crane including a crane runner that runs along the crane overhead track, a mast hanging down from the crane runner, and an article transferor that moves upward or downward by being guided by the mast, the suspension crane being capable of transporting the article between the storages and the delivery port, the stocker being disposed in a stocker area, an overhead-transport-vehicle overhead track disposed outside of the stocker area and extending along the delivery port and a load port of a processing tool to a predetermined area, an overhead transport vehicle including a transport vehicle runner that runs along the overhead-transport-vehicle overhead track and an article holder that holds the article and moves upward or downward to transport the article between the delivery port and the load port, and a joint track connecting the crane overhead track with the overhead-transport-vehicle overhead track; and
causing the crane runner to enter the overhead-transport-vehicle overhead track from the crane overhead track via the joint track and run on the overhead-transport-vehicle overhead track to the predetermined area, or causing the crane runner to enter the overhead-transport-vehicle overhead track from the predetermined area and run to the joint track, and enter and run on the crane overhead track via the joint track.

* * * * *